United States Patent
Wang et al.

(10) Patent No.: US 11,223,349 B2
(45) Date of Patent: Jan. 11, 2022

(54) JOINT CONTROL METHOD WITH VARIABLE ZVS ANGLES FOR DYNAMIC EFFICIENCY OPTIMIZATION IN WIRELESS POWER CHARGING FOR ELECTRIC VEHICLES

(71) Applicant: Xi'an Jiaotong University, Shaanxi (CN)

(72) Inventors: Yue Wang, Shaanxi (CN); Yongbin Jiang, Shaanxi (CN); Chenxu Zhao, Shaanxi (CN); Ruibang Li, Shaanxi (CN); Yonghui Liu, Shaanxi (CN); Min Wu, Shaanxi (CN); Laili Wang, Shaanxi (CN); Xu Yang, Shaanxi (CN)

(73) Assignee: Xi'an Jiaotong University, Xi'an (CN)

( * ) Notice: Subject to any disclaimer, the term of this patent is extended or adjusted under 35 U.S.C. 154(b) by 152 days.

(21) Appl. No.: 16/729,391

(22) Filed: Dec. 28, 2019

(65) Prior Publication Data

US 2021/0135666 A1 May 6, 2021

(30) Foreign Application Priority Data

Oct. 31, 2019 (CN) .......................... 201911074119.2

(51) Int. Cl.
  *H02J 7/00* (2006.01)
  *H03K 17/13* (2006.01)
  *H02J 50/12* (2016.01)
  *H02J 50/70* (2016.01)
  *B60L 53/62* (2019.01)
  *B60L 53/122* (2019.01)

(52) U.S. Cl.
  CPC .......... *H03K 17/133* (2013.01); *B60L 53/122* (2019.02); *B60L 53/62* (2019.02); *H02J 50/12* (2016.02); *H02J 50/70* (2016.02)

(58) Field of Classification Search
  USPC .......................... 320/104, 132, 134, 135, 136
  See application file for complete search history.

(56) References Cited

U.S. PATENT DOCUMENTS 6,215,271 B1 * 4/2001 Lerow ................... H02J 7/1492
  320/104
10,461,566 B2 * 10/2019 Lee ................... H02M 3/33584

FOREIGN PATENT DOCUMENTS

| CN | 102832830 A | * | 12/2012 |  |
| CN | 108347088 A | * | 7/2018 |  |
| WO | WO-2013112614 A1 | * | 8/2013 | ............ B60L 53/122 |

* cited by examiner

*Primary Examiner* — Brian Ngo

(57) ABSTRACT

A joint control method with variable ZVS angles for dynamic efficiency optimization in a WPC system for EVs under ZVS conditions, including: adjusting a phase-shift duty cycle of a secondary active rectifier to control a charging voltage and a charging current of EV's batteries through a charging voltage closed loop and a charging current closed loop, respectively; adjusting a power angle of the secondary active rectifier to control a ZVS angle of the secondary active rectifier through a secondary ZVS angle closed loop; adjusting a phase-shift duty cycle of a primary inverter to control a ZVS angle of the primary inverter through the primary ZVS angle closed loop; determining the current operating case of the WPC system and adjusting the ZVS angles of the primary inverter and the secondary active rectifier to automatically identify an optimal operating point with a maximum charging efficiency through the P&O method.

6 Claims, 6 Drawing Sheets

JOINT CONTROL METHOD WITH VARIABLE ZVS ANGLES FOR DYNAMIC EFFICIENCY OPTIMIZATION IN WIRELESS POWER CHARGING FOR ELECTRIC VEHICLES

CROSS-REFERENCE TO RELATED APPLICATIONS

This application claims the benefit of priority from Chinese Patent Application No. 201911074119.2, filed on Oct. 31, 2019. The content of the aforementioned application, including any intervening amendments thereto, is incorporated herein by reference in its entirety.

TECHNICAL FIELD

The invention relates to wireless power charging (WPC), more particularly to a joint control method with variable zero-voltage-switching (ZVS) angles (JC-VZA) for dynamic efficiency optimization in WPC for electric vehicles (EVs) under ZVS conditions.

BACKGROUND OF THE INVENTION

WPC is a safe and convenient method for electric power transfer. It is flexible and user-friendly with the adaptability to harsh environments, and enables mobile power supply. WPC techniques based on near-field coupling are promising in EVs, consumer electronics, sensors and implanted devices since it well satisfies the requirements on transfer distance, efficiency, power level and safety. Currently, due to the widespread use of the EVs, WPC techniques for the EVs are becoming a research hotspot. However, in the control of WPC systems for the EVs, there are several requirements.

(1) Stable charging voltage and charging current: as a power source, WPC systems are required to provide a stable charging voltage and charging current for the EVs.

(2) Minimum switching loss: a series-series (SS) compensated WPC system needs to adopt a high-frequency inverter and an active rectifier. The high-frequency inverter and the active rectifier are generally designed with Metal-Oxide-Semiconductor Field-Effect Transistor (MOSFET) devices. In order to reduce switching losses, both the inverter and the active rectifier need to achieve ZVS.

(3) Maximum overall transfer efficiency under various operating conditions: In the whole charging process of EV's batteries, WPC systems should achieve the maximum transfer efficiency under various operating conditions to reduce power losses and the volume of heat sinks, in order to improve the power density of WPC systems and save electric energy.

(4) Excellent anti-interference performance: in practical applications, when the load changes, the control system needs to automatically adjust control variables to track the reference signals from the EV's batteries.

(5) Fewer converters: in the WPC system for the EVs, it is significant to reduce the number of converters, which is beneficial for reducing the system cost and complexity, improving the maximum transfer efficiency and power density.

On the one hand, in order to reduce switching losses of the primary and secondary converters, the primary and secondary converters are required to achieve ZVS; on the other hand, in the practical applications of WPC systems for the EVs, the charging voltage and the charging current will change continuously in the whole charging process of the EV's batteries, and the power losses of WPC systems will change greatly. Therefore, it is vital to adjust the control variables reasonably to minimize the power losses of WPC systems under ZVS conditions. Currently, it is still lack of the multi-objective control method to satisfy the five requirements mentioned above.

In summary, it is necessary to propose a novel control method to meet five aforementioned requirements in the WPC system for the EVs.

SUMMARY OF THE INVENTION

To overcome the disadvantages of the prior art, the invention provides a joint control method for dynamic efficiency optimization in an SS compensated WPC system for EVs under ZVS conditions, which not only realizes ZVS of all switches in the primary inverter and the secondary active rectifier while maintaining a stable charging voltage or charging current, but also automatically identifies the optimal operating point to minimize the system power loss.

To achieve the aforementioned objectives, the invention provides a JC-VZA for dynamic efficiency optimization in a WPC system for EVs under ZVS conditions, comprising:

adjusting a phase-shift duty cycle of a secondary active rectifier to control a charging voltage/current of EV's batteries through a charging voltage/current closed loop;

adjusting a power angle of the secondary active rectifier to control a ZVS angle of the secondary active rectifier through a secondary ZVS angle closed loop;

adjusting a phase-shift duty cycle of a primary inverter to control a ZVS angle of the primary inverter through a primary ZVS angle closed loop; and detecting an input DC voltage $V_1$ and an input DC current $I_1$ of the primary inverter in real time; detecting an output DC voltage $V_2$ and an output DC current $I_2$ of the secondary active rectifier in real time; calculating a voltage gain $K_{cv}$ and a per-unit transfer power $P_u$; determining a current operating condition of the WPC system based on the voltage gain $K_{cv}$ and the per-unit transfer power $P_u$; and adjusting the ZVS angle of the primary inverter and the ZVS angle of the secondary active rectifier to automatically identify an optimal operating point with a maximum charging efficiency through a perturb-and-observe (P&O) method.

In some embodiments, the step of adjusting the phase-shift duty cycle of the secondary active rectifier to control the charging voltage/current of the EV's batteries through the charging voltage/current closed loop comprises:

sampling the charging voltage and current of the EV's batteries in the charging voltage closed loop and the charging current closed loop to obtain sampled signals; comparing the sampled signals of the charging voltage and current of the EV's batteries with a preset charging voltage reference value and a preset charging current reference value, respectively, to obtain a first error signal of the secondary charging voltage and a first error signal of the secondary charging current;

inputting the first error signal of the secondary charging voltage and the first error signal of the secondary charging current into a PID regulator of the charging voltage closed loop and a PID regulator of the charging current closed loop, respectively; and selecting a smaller output signal between an output signal of the HD regulator of the secondary charging voltage closed loop and an output signal of the HD regulator of the secondary charging current closed loop as the phase-shift duty cycle $D_s$ of the secondary active rectifier after amplitude limiting; adjusting the output DC voltage and the output DC current of the secondary active rectifier through changing the phase-shift duty cycle $D_s$ of the secondary active rectifier to control the charging voltage and the charging current of the EV's batteries.

In some embodiments, the step of adjusting the power angle of the secondary active rectifier to control the ZVS angle of the secondary active rectifier through the secondary ZVS angle closed loop comprises:

calculating a current feedback signal $\varphi_{ZAsfb}$ of the ZVS angle of the secondary active rectifier according to the phase-shift duty cycle $D_s$ and the power angle $\delta$ of the secondary active rectifier at a previous moment in the secondary ZVS angle closed loop;

comparing the current feedback signal $\varphi_{ZAsfb}$ of the ZVS angle of the secondary active rectifier with a reference signal $\varphi^*_{ZAs}$ of the secondary ZVS angle to obtain a second error signal; and inputting the second error signal into the PID regulator of the secondary ZVS angle closed loop to obtain an output result of the PID regulator as the power angle $\delta$ of the secondary active rectifier at a next moment, in order to adjust the ZVS angle of the secondary active rectifier.

In some embodiments, the step of adjusting the phase-shift duty cycle of the primary inverter to control the ZVS angle of the primary inverter through the primary ZVS angle closed loop comprises:

sampling a current feedback signal $\varphi_{ZApfb}$ of the primary inverter ZVS angle in the primary ZVS angle closed loop;

comparing the current feedback signal $\varphi_{ZApfb}$ of the ZVS angle of the primary inverter with a reference signal $\varphi^*_{ZAp}$ of the primary ZVS angle to obtain a third error signal;

inputting the third error signal into the PID regulator of the primary ZVS angle closed loop to obtain an output result of the MD regulator as the phase-shift duty cycle $D_p$ of the primary inverter at a next moment, in order to adjust the ZVS angle of the primary inverter;

sampling the input DC voltage $V_1$ and the input DC current $I_1$ of the primary inverter through a controller of the primary inverter to obtain sampled signals, and sampling the output DC voltage $V_2$ and the output DC current $I_2$ of the secondary active rectifier through a controller of the secondary active rectifier to obtain sampled signals;

exchanging the sampled signals from the input DC voltage and current of the primary inverter in the primary controller with the sampled signals from the output DC voltage and current of the secondary active rectifier in the secondary controller through a wireless communication technology; and calculating current voltage gain $K_{cv}$ and per-unit charging power $P_u$ by the controllers of the primary inverter and the secondary active rectifier, respectively, based on the input DC voltage $V_1$ and the input DC current $I_1$ of the primary inverter, the output DC voltage $V_2$ and the output DC current $I_2$ of the secondary active rectifier, an equivalent series resistance $R'_1$ of a primary resonant network and an equivalent series resistance $R'_2$ of a secondary resonant network, where the current voltage gain $K_{cv}$ is represented as:

$$K_{cv} = \frac{V_2}{V_1};$$

the per-unit charging power $P_u$ is represented as:

$$P_u = \frac{P_2}{P_{2max}} = \sin\left[\frac{D_p\pi}{2}\right]\sin\left[\frac{D_s\pi}{2}\right]\cos[\delta];$$

wherein, $P_2$ is the actual charging power at the DC side of the secondary active rectifier, $P_{2max}$ is the maximum output power at the DC side of the secondary active rectifier, and $P_{2max}$ is represented as:

$$P_{2max} = \frac{8V_1V_2}{\pi^2\omega_0 M};$$

the equivalent series resistance $R'_1$ of the primary resonant network and the equivalent series resistance $R'_2$ of the secondary resonant network are represented as:

$$\begin{cases} R'_1 = R_1 + 2R_{dson1} \\ R'_2 = R_2 + 2R_{dson2} \end{cases};$$

wherein, $R_1$ is the equivalent series resistance of the primary resonant coil and the resonant capacitor, $R_2$ is the equivalent series resistance of the secondary resonant coil and the resonant capacitor, $R_{dson1}$ is the on-time drain-to-source resistance of the MOSFET switch in the primary inverter, and $R_{dson2}$ is the on-time drain-to-source resistance of the MOSFET switch in the secondary active rectifier;

based on the voltage gain $K_{cv}$ and the per-unit charging power $P_u$, the controllers of the primary inverter and the secondary active rectifier determine the optimal operating condition where the WPC system for the EVs achieves the minimum power loss according to the following logic rules:

if $P_u \geq 2R'_1 K_{cv}^2/R'_2 = P_{uc1}$ and $K_{cv} < \sqrt{R'_2/2R'_1}$, the WPC system operates in Case I;

if $P_u < 2R'_1 K_{cv}^2/R'_2 = P_{uc1}$ and $K_{cv} < \sqrt{R'_2/2R'_1}$, the WPC system operates in Case II;

if $\sqrt{R'_2/2R'_1} \leq K_{cv} \leq \sqrt{2R'_2/R'_1}$, the WPC system operates in Case III;

if $P_u < 2R'_2/R'_1 K_{cv}^2 = P_{uc2}$ and $K_{cv} > \sqrt{2R'_2/R'_1}$, the WPC system operates in Case IV;

if $P_u \geq 2R'_2/R'_1 K_{cv}^2 = P_{uc2}$ and $K_{cv} > \sqrt{2R'_2/R'_1}$, the WPC system operates in Case V.

When the WPC system operates in Case III, the reference values of the ZVS angles of the primary inverter and the secondary active rectifier are set to 0°; when the WPC system operates in Case I or Case II, the reference value of the ZVS angle of the primary inverter is set to 0°, and the ZVS angle of the secondary active rectifier is continuously adjusted with the perturb-and-observe method to obtain a maximum transfer efficiency of the WPC system under ZVS conditions; when the WPC system operates in Case IV or Case V, the reference value of the ZVS angle of the secondary active rectifier is set to 0°, and the ZVS angle of the primary inverter is continuously adjusted with the perturb-and-observe method to obtain the maximum transfer efficiency of the WPC system under ZVS conditions.

The invention has the following beneficial effects. The JC-VZA for dynamic efficiency optimization in the WPC system for the EVs under ZVS conditions of the present invention includes: adjusting the charging voltage and charging current of the EV's batteries through the charging voltage closed loop and the charging current closed loop of the secondary active rectifier to meet charging requirements of the EV's batteries; detecting the input DC voltage $V_1$ of the primary inverter and the output DC voltage $V_2$ of the secondary active rectifier in real time to confirm regulation rules of the ZVS angles of the primary inverter and secondary active rectifier; controlling the ZVS angle of the primary inverter and the ZVS angle of the secondary active rectifier through the ZVS angle closed loop of the primary inverter and the ZVS angle closed loop of the secondary active rectifier, respectively; adjusting the ZVS angles of the primary inverter and secondary active rectifier in real time through the P&O method to make the WPC system operate at the minimum power loss point under the corresponding operating condition. Benefiting from the proposed JC-VZA for dynamic efficiency optimization in the WPC system for the EVs under ZVS conditions, the WPC system can achieve a very high overall transfer efficiency; moreover, due to eliminated wireless communication modules in the charging voltage/current closed loop, it can greatly improve the reliability of the WPC system, especially in complex electromagnetic environments.

DETAILED DESCRIPTION OF EMBODIMENTS

The invention is further described in detail below with reference to the accompanying drawings.

Figure 1:
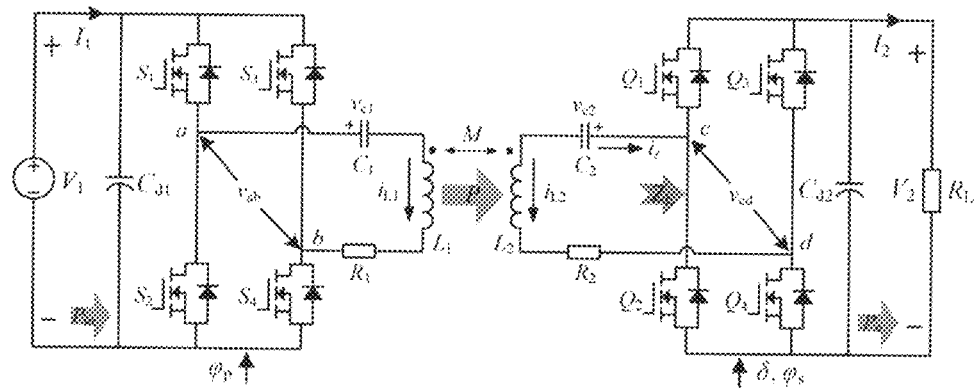
FIG. 1 is a circuit diagram of a series-series compensated WPC system of the present invention.

Referring to FIG. 1, the present invention provides a joint control method for dynamic efficiency optimization in a WPC system for EVs under ZVS conditions, comprising the following steps.

(1) A phase-shift duty cycle of a secondary active rectifier is adjusted to control the charging current/voltage of EV's batteries through a charging current/voltage closed loop.

Specifically, the charging voltage and current of the EV's batteries are sampled in the charging voltage closed loop and the charging current closed loop;

the sampled signals of the charging voltage and current of the EV's batteries are compared with a preset charging voltage reference value and a preset charging current reference value, respectively, to obtain a first error signal of the secondary charging voltage and a first error signal of the secondary charging current;

the first error signal of the secondary charging voltage and the first error signal of the secondary charging current are input into the PID regulator of the charging voltage closed loop and the PID regulator of the charging current closed loop, respectively;

a smaller output signal is selected between an output signal of the PID regulator of the secondary charging voltage closed loop and an output signal of the PID regulator of the secondary charging current closed loop as a phase-shift duty cycle $D_s$ of the secondary active rectifier after amplitude limiting; and the output DC voltage/current of the secondary active rectifier is adjusted through changing the phase-shift duty cycle $D_s$ of the secondary active rectifier to control the charging voltage/current of the EV's batteries.

(2) The power angle of the secondary active rectifier is adjusted to control the ZVS angle of the secondary active rectifier through the secondary ZVS angle closed loop.

Specifically, the current feedback signal $\varphi_{ZAsfb}$ of the ZVS angle of the secondary active rectifier is calculated according to the phase-shift duty cycle $D_s$ and the power angle δ of the secondary active rectifier at a previous moment in the secondary ZVS angle closed loop;

the current feedback signal $\varphi_{ZAsfb}$ of the ZVS angle of the secondary active rectifier is compared with the reference signal $\varphi^*_{ZAs}$ of the secondary ZVS angle to obtain a second error signal; and the second error signal is input into the PID regulator of the secondary ZVS angle closed loop to obtain the output result of the PID regulator as the power angle δ of the secondary active rectifier at the next moment, in order to adjust the ZVS angle of the secondary active rectifier.

(3) The phase-shift duty cycle of the primary inverter is adjusted to control the ZVS angle of the primary inverter through the primary ZVS angle closed loop.

Specifically, the current feedback signal $\varphi_{ZApfb}$ of the primary inverter ZVS angle is sampled in the primary ZVS angle closed loop;

the current feedback signal $\varphi_{ZApfb}$ of the ZVS angle of the primary inverter is compared with the reference signal $\varphi^*_{ZAp}$ of the primary ZVS angle to obtain a third error signal; and the third error signal is input into the PID regulator of the primary ZVS angle closed loop to obtain the output result of the PID regulator as the phase-shift duty cycle $D_p$ of the primary inverter at the next moment, in order to adjust the ZVS angle of the primary inverter.

(4) The input DC voltage $V_1$ and the input DC current $I_1$ of the primary inverter and the output DC voltage $V_2$ and the output DC current $I_2$ of the secondary active rectifier are detected in real time;

the controllers of the primary inverter and the secondary active rectifier calculate the voltage gain $K_{cv}$ and the per-unit transfer power $P_u$;

the current case of the WPC system is determined based on the voltage gain $K_{cv}$ and the per-unit transfer power $P_u$; and the ZVS angle of the primary inverter and the ZVS angle of the secondary active rectifier are adjusted to find out an optimal operating point with the maximum charging efficiency through the P&O method.

Specifically, the input DC voltage $V_1$ and the input DC current $I_1$ of the primary inverter are sampled through the controller of the primary inverter, and the output DC voltage $V_2$ and the output DC current $I_2$ of the secondary active rectifier are sampled through the controller of the secondary active rectifier; the sampled signals from the input DC voltage and current of the primary inverter in the primary controller are exchanged with the sampled signals from the output DC voltage and current of the secondary active rectifier in the secondary controller through the wireless communication technology; based on the input DC voltage $V_1$ and the input DC current $I_1$ of the primary inverter, the output DC voltage $V_2$ and the output DC current $I_2$ of the secondary active rectifier, the equivalent series resistance $R'_1$ of the primary resonant network and the equivalent series resistance $R'_2$ of the secondary resonant network, the current voltage gain Key and the per-unit charging power $P_u$ are calculated by the controllers of the primary inverter and the secondary active rectifier, where the current voltage gain $K_{cv}$ is represented as:

$$K_{cv} = \frac{V_2}{V_1};$$

the per-unit charging power $P_u$ is represented as:

$$P_u = \frac{P_2}{P_{2max}} = \sin\left[\frac{D_p \pi}{2}\right]\sin\left[\frac{D_s \pi}{2}\right]\cos[\delta];$$

wherein, $P_2$ is the actual charging power at the DC side of the secondary active rectifier, $P_{2max}$ is the maximum output power at the DC side of the secondary active rectifier, and $P_{2max}$ is represented as:

$$P_{2max} = \frac{8V_1V_2}{\pi^2 \omega_0 M};$$

the equivalent series resistance $R'_1$ of the primary resonant network and the equivalent series resistance $R'_2$ of the secondary resonant network are represented as:

$$\begin{cases} R'_1 = R_1 + 2R_{dson1} \\ R'_2 = R_2 + 2R_{dson2} \end{cases};$$

wherein, $R_1$ is the equivalent series resistance of the primary resonant coil and the resonant capacitor, $R_2$ is the equivalent series resistance of the secondary resonant coil and the resonant capacitor, $R_{dson1}$ is the on-time drain-to-source resistance of the MOSFET switch in the primary inverter, and $R_{dson2}$ is the on-time drain-to-source resistance of the MOSFET switch in the secondary active rectifier;

based on the voltage gain $K_{cv}$ and the per-unit charging power $P_u$, the controllers of the primary inverter and the secondary active rectifier determine the optimal operating condition where the WPC system for the EVs achieves the minimum power loss according to the following logic rules:

if $P_u \geq 2R'_1 K_{cv}^2/R'_2 = P_{uc1}$ and $K_{cv} < \sqrt{R'_2/2R'_1}$, the WPC system operates in Case I;

if $P_u < 2R'_1 K_{cv}^2/R'_2 = P_{uc1}$ and $K_{cv} < \sqrt{R'_2/2R'_1}$, the WPC system operates in Case II;

if $\sqrt{R'_2/2R'_1} \leq K_{cv} \leq \sqrt{2R'_2/R'_1}$, the WPC system operates in Case III;

if $P_u < 2R'_2/R'_1 K_{cv}^2 = P_{uc2}$ and $K_{cv} > \sqrt{2R'_2/R'_1}$, the WPC system operates in Case IV;

if $P_u \geq 2R'_2/R'_1 K_{cv}^2 = P_{uc2}$ and $K_{cv} > \sqrt{2R'_2/R'_1}$, the WPC system operates in Case V.

Figure 2:
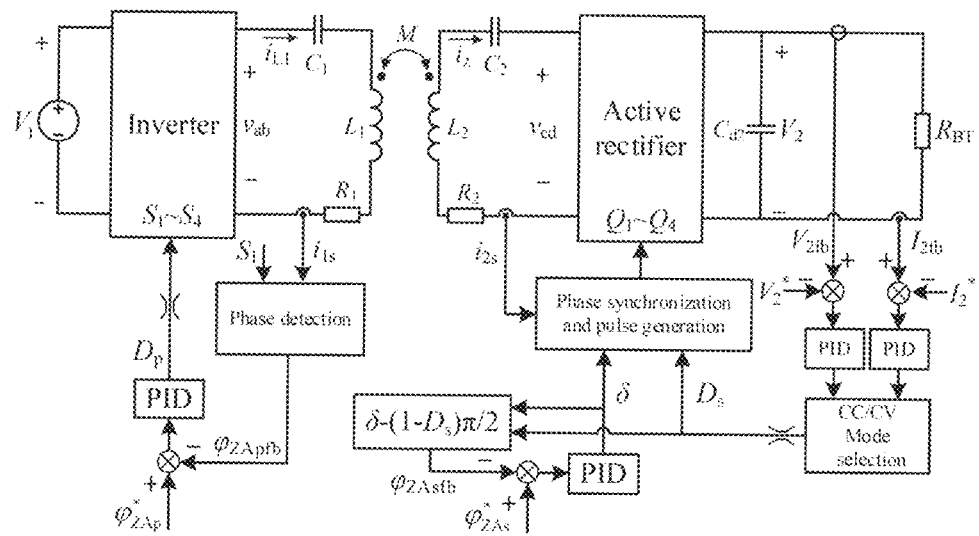
FIG. 2 is a control diagram of the WPC system of the present invention.

Referring to FIG. 2, when the WPC system operates in Case III, the reference values of the ZVS angles of the primary inverter and the secondary active rectifier are set to 0°; when the WPC system operates in Case I or Case II, the reference value of the ZVS angle of the primary inverter is set to 0°, and the reference value of the ZVS angle of the secondary active rectifier is continuously adjusted to achieve the maximum transfer efficiency of the WPC system under ZVS conditions through the P&O method; when the WPC system operates in Case IV or Case V, the reference value of the ZVS angle of the secondary active rectifier is set to 0°, and the reference value of the ZVS angle of the primary inverter is continuously adjusted to achieve the maximum transfer efficiency of the WPC system under ZVS conditions through the P&O method.

Figure 3:
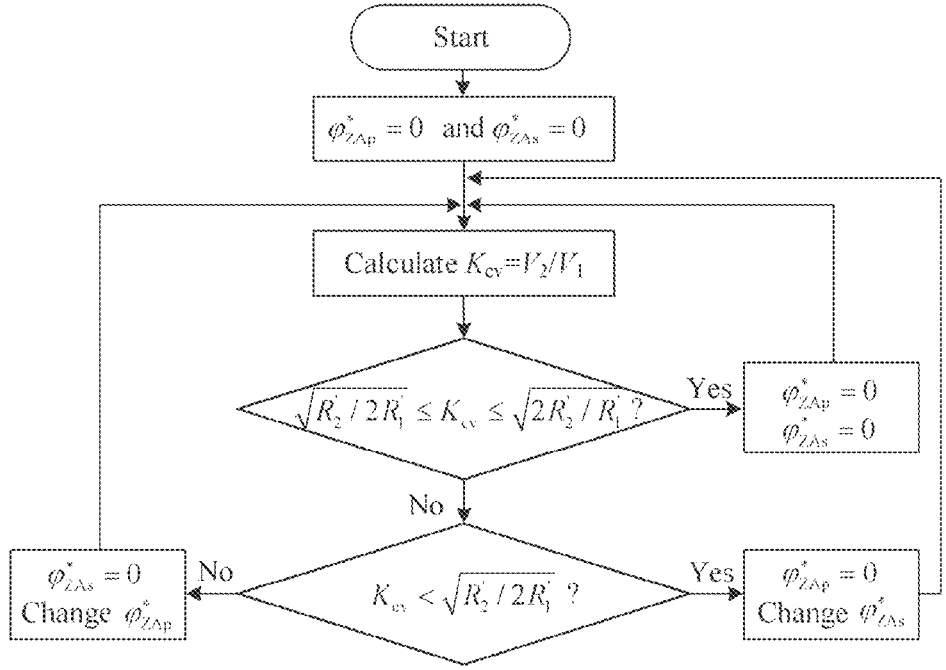
FIG. 3 is a flowchart of the dynamic efficiency optimization for determining operating conditions of the WPC system based on the voltage gain $K_{cv}$ of the present invention.

Referring to FIG. 3, taking Case I and Case II as examples, the step of continuously adjusting the ZVS angle of the secondary active rectifier to find out the optimal operating point with the maximum transfer efficiency through the P&O method includes the following parts.

The input DC voltage $V_1$ and the input DC current $I_1$ of the primary inverter are sampled by the controller of the primary inverter; next, the data sampled by the controller of the primary inverter is sent to the controller of the secondary active rectifier; afterwards, the controller of the secondary active rectifier calculates the input power $P_1$ based on the received data sent from the controller of the primary inverter; meanwhile, the output DC voltage $V_2$ and the output DC current $I_2$ of the secondary active rectifier are sampled by the controller of the secondary active rectifier, and an output power $P_2$ based on the output DC voltage $V_2$ and the output DC current $I_2$ of the secondary active rectifier are calculated; then, the current charging efficiency is calculated based on the input power $P_1$ and the output power $P_2$; the judgment rules of the P&O method are described as follows:

if the current charging efficiency after the perturbation is greater than the charging efficiency before the perturbation, it is necessary to increase the reference value $\varphi^*_{ZAs}$ of the ZVS angle of the secondary active rectifier with $\Delta\varphi$ at the next moment;

if the current charging efficiency after the perturbation is less than the charging efficiency before the perturbation, it is necessary to decrease the reference value $\varphi^*_{ZAs}$ of the ZVS angle of the secondary active rectifier with Δφ at the next moment; and if the current charging efficiency after the perturbation is equal to the charging efficiency before the perturbation, the reference value $\varphi^*_{ZAs}$ of the ZVS angle of the secondary active rectifier keeps constant at the next moment.

When the WPC system operates in Case IV or Case V, the specific operation of continuously adjusting the ZVS angle of the primary inverter to find out the optimal operating point with the maximum transfer efficiency is similar to Case I or Case I$_1$.

Example 1

Referring to FIG. 1, taking the 500-W WPC prototype as an example, when the input DC voltage of the primary inverter is set to 80 V, the WPC system operates as follows: the inverter adopts the phase shift control to convert the input DC voltage to a high-frequency AC square voltage that drives the resonant network on the primary side. Consequently, the primary coil generates a high-frequency electromagnetic field which is induced by the secondary coil. Then, the secondary coil generates a high-frequency AC voltage which powers the EV's batteries through the secondary active rectifier and the filter capacitors with the output DC voltage $V_2$. The charging process is controlled by using the proposed JC-VZA method for dynamic efficiency optimization shown in FIGS. 2-4.

Based on the logic rules shown in FIG. 3, the specific operation of determining the operating cases of the system is described as follows.

According to the input DC voltage $V_1$ of the primary inverter and the output DC voltage $V_2$ of the secondary active rectifier, the voltage gain $K_{cv}$ is calculated by the controllers of the primary inverter and the secondary active rectifier, respectively, where $K_{cv}=V_2/V_1$; based on the equivalent series resistance $R'_1$ of the primary resonant network and the equivalent series resistance $R'_2$ of the secondary resonant network, the values of $\sqrt{R'_2/2R'_1}$ and $\sqrt{2R'_2/R'_1}$ are calculated, and the relationships of $K_{cv}$, $\sqrt{R'_2/2R'_1}$ and $\sqrt{2R'_2/R'_1}$ are determined;

if $K_{cv}$ satisfies $\sqrt{R'_2/2R'_1} \leq \sqrt{2R'_2/R'_1}$, the WPC system should operate in Case III, and it is necessary to set the reference values of the ZVS angles of the primary inverter and secondary active rectifier to 0°;

if $K_{cv}$ satisfies $K_{cv}<\sqrt{R'_2/2R'_1}$, the WPC system should operate in Case I or Case II, and it is necessary to set the reference value of the ZVS angle of the primary inverter to 0°, and continuously adjust the ZVS angle of the secondary active rectifier based on the P&O method to achieve the maximum transfer efficiency of the system under ZVS conditions;

if $K_{cv}$ satisfies $K_{cv}>\sqrt{2R'_2/R'_1}$, the system should operate in the Case IV or Case V, and it is necessary to set the reference value of the ZVS angle for the secondary active rectifier to 0°, and continuously adjust the ZVS angle of the primary inverter based on the P&O method to achieve the maximum transfer efficiency of the system under ZVS conditions.

Figure 4:
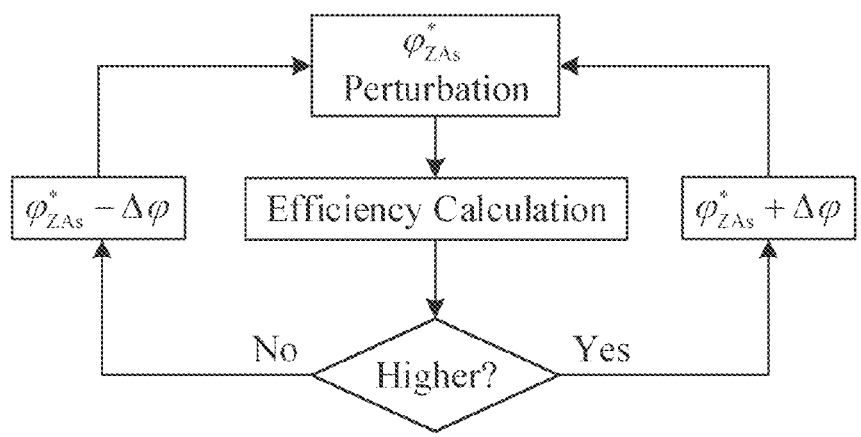
FIG. 4 is a flowchart of the P&O method with the variable ZVS angle of the secondary active rectifier to track the maximum transfer efficiency.

Referring to FIG. 4, taking the Case I or Case II as an example, the specific operation of continuously adjusting the ZVS angle of the secondary active rectifier to identify the optimal operating point with the maximum charging efficiency through the P&O method is described as follows.

The charging efficiency after the perturbation is calculated based on the input power $P_1$ and the output power $P_2$; if the current charging efficiency after the perturbation is higher than the charging efficiency before the perturbation, it is necessary to set the reference value of the ZVS angle of the secondary active rectifier to $\varphi^*_{ZAs}+\Delta\varphi$ at the next moment; if the current charging efficiency after the perturbation is lower than the charging efficiency before the perturbation, it is necessary to set the reference value of the ZVS angle of the secondary active rectifier to $\varphi^*_{ZAs}-\Delta\varphi$ at the next moment; if the current charging efficiency after the perturbation is equal to the charging efficiency before the perturbation, the reference value of the ZVS angle of the secondary active rectifier should be kept constant at the next moment.

In order to illustrate the effectiveness of the present invention, the WPC system of the EVs with the parameters listed in Table 2 is validated by experimental results.

According to the experimental parameters in Table 2, when the coupling coefficient k is set to 0.1, the voltage gains of the output DC voltage of the secondary active rectifier to the input DC voltage of the primary inverter are set to 80 V/80 V, 60 V/80 V, and 80 V/60 V, and the load resistances $R_L$ are set to 20Ω, 15Ω and 26.7Ω, respectively; the calculated per-unit charging powers $P_u$ in the three cases mentioned above are 0.388. According to Table 1, the WPC system in the aforementioned three cases should operate in Case III, i.e. the minimum power loss point of the WPC system is located at point O. Therefore, the reference values of the ZVS angles of the primary inverter and the secondary active rectifier are set to 0°.

Figure 5A:
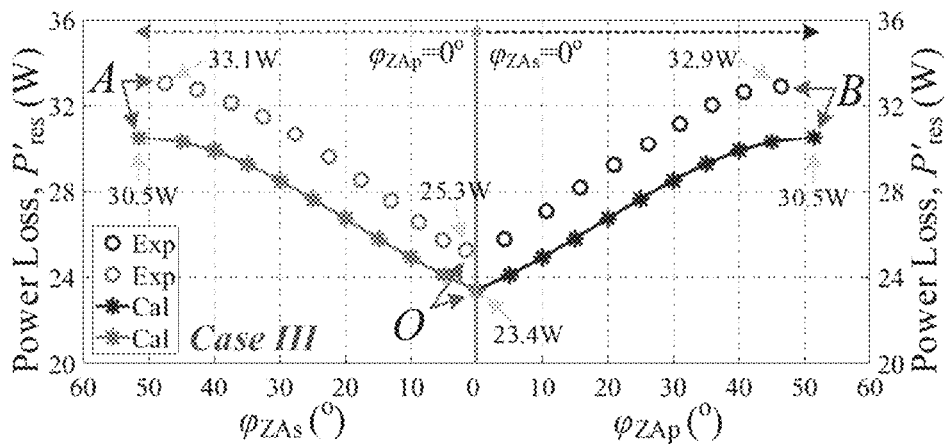
FIG. 5a is a graph of the power loss distribution when the WPC system is in Case III, in which $V_1$=80 V, $V_2$=80 V, $I_2$=4 A, the load resistance $R_L$=20Ω, the coupling coefficient k=0.1, the voltage gain of the system $K_{cv}$=1, and the per-unit charging power $P_u$=0.388.
Figure 5B:
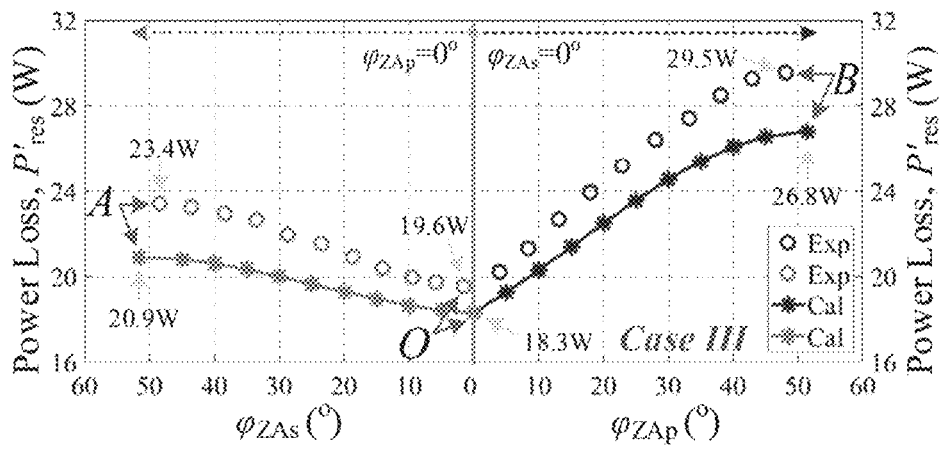
FIG. 5b is a graph of the power loss distribution when the WPC system is in Case III, in which $V_1$=80 V, $V_2$=60 V, $I_2$=4 A, the load resistance $R_L$=15Ω, the coupling coefficient k=0.1, the voltage gain of the system $K_{cv}$=0.75, and the per-unit charging power $P_u$=0.388.
Figure 5C:
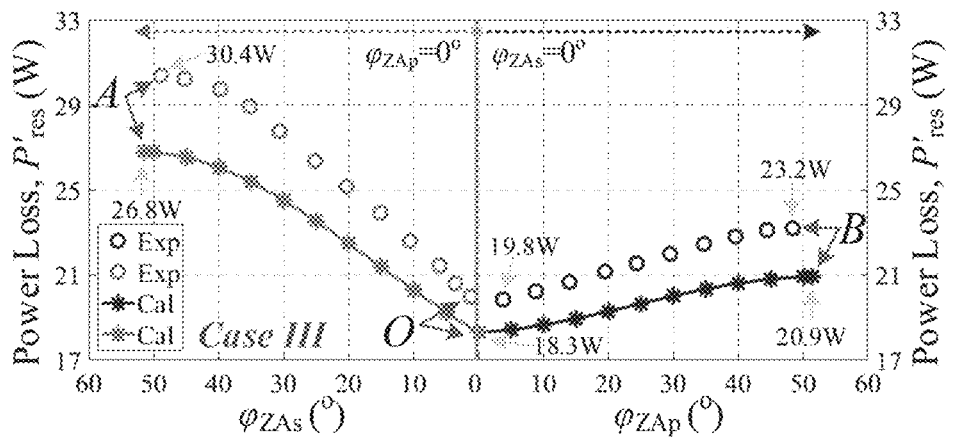
FIG. 5c is a graph of the power loss distribution when the WPC system is in Case III, in which $V_1$=60 V, $V_2$=80 V, $I_2$=3 A, the load resistance $R_L$=26.7Ω, the coupling coefficient k=0.1, the voltage gain of the system $K_{cv}$=1.33, and the per-unit charging power $P_u$=0.388.

Under the critical ZVS conditions, the relationships between the power loss distribution of the WPC system on the boundary curves AOB and different ZVS angles at three different operating situations are shown in FIGS. 5a-c. In these drawings, the continuous curves drawn by "*" are the theoretical calculation values of the system power losses when the WPC system operates at different ZVS angles. The discrete points plotted by "o" are the measurement values of the system power losses when the WPC system operates at different ZVS angles. The theoretical calculation values and experimental results show that point O is the optimal operating point with the minimum power loss, which verifies the correctness of the aforementioned conclusions in Table 1.

It can be found from FIGS. 5a-c that the optimal operating point with the minimum power loss can be directly identified by using the JC-VZA for dynamic efficiency optimization of the present invention.

When the coupling coefficient k is set to 0.1, the voltage gain of the output DC voltage of the secondary active rectifier to the input DC voltage of the primary inverter is set to 30V/80V, and the load resistances $R_1$, are set to ion and 20Ω, respectively; the calculated per-unit charging powers $P_u$ in these two cases are 0.291 and 0.146, respectively. According to Table 1, the WPC system in the aforementioned two cases should operate in Case I or Case II, respectively, i.e., the optimal operating points with the minimum power loss are located at point A or a certain point on trajectory AO respectively. Therefore, the ZVS angle of the primary inverter $\varphi^*_{ZAp}$ should be set to 0°, and the ZVS angle of the secondary active rectifier $\varphi^*_{ZAs}$ is adjusted in real time through the P&O method to identify the optimal operating point with the minimum power loss.

Figure 6A:
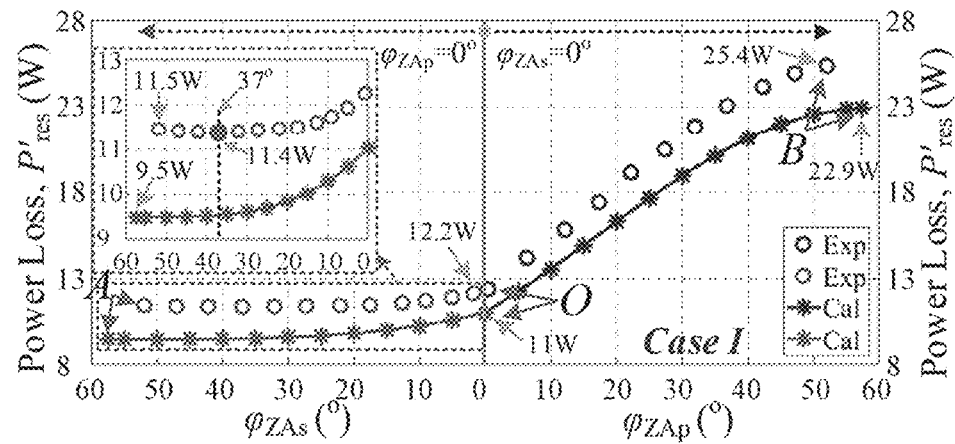
FIG. 6a is a graph of the power loss distribution when the WPC system is in Case I, in which $V_1$=80 V, $V_2$=30 V, $I_2$=3 A, the load resistance $R_L$=10 n, the coupling coefficient k=0.1, the voltage gain of the system $K_{cv}$=0.375, and the per-unit charging power $P_u$=0.291.
Figure 6B:
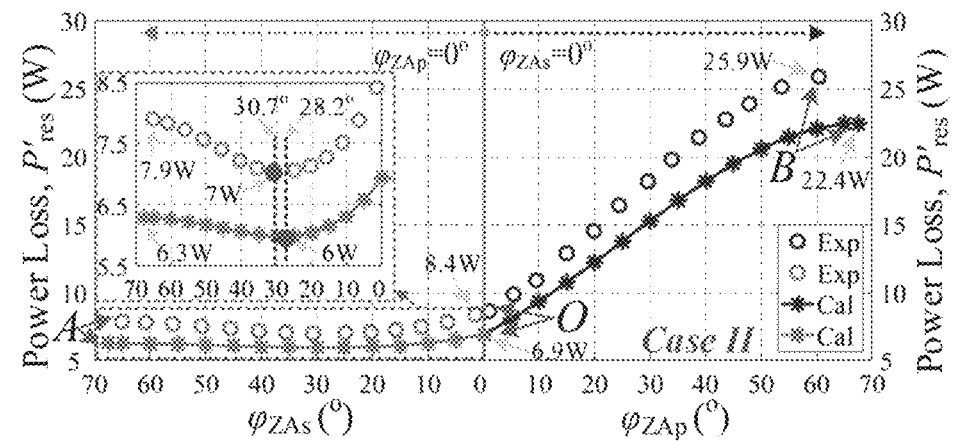
FIG. 6b is a graph of the power loss distribution when the WPC system is in Case $I_1$, in which $V_1$=80 V, $V_2$=30 V, $I_2$=1.5 A, the load resistance $R_L$=20Ω, the coupling coefficient k=0.1, the voltage gain of the system $K_{cv}$=0.375, and the per-unit charging power $P_u$=0.146.

Under the critical ZVS conditions, the relationships between the power loss distribution of the WPC system on the boundary curves and different ZVS angles at these two operating situations are shown in FIGS. 6a-b. In these drawings, the continuous curves drawn by "*" are the theoretical calculation values of the system power losses when the WPC system operates at different ZVS angles. The discrete points plotted by "o" are the measurement values of the system power losses when the WPC system operates at different ZVS angles.

In FIG. 6a, $P_u=0.291>0.281=P_{uc1}$, and the system should operate in Case I. According to Table 1, point A is the optimal operating point with the minimum power loss, and the theoretical calculation results verify the correctness of the conclusions in Table 1. However, the experimental results show that the WPC system achieves the minimum power loss when the ZVS angle of the secondary active rectifier is set to 37°. The basic reason is that the turn-off loss of the secondary active rectifier slightly increases with the increase of the ZVS angle of the secondary active rectifier. However, the optimal operating point with the minimum power loss can still be automatically identified through the P&O method.

In FIG. 6b, $P_u=0.146<0.281=P_{uc1}$, and the system should operate in Case II. According to Table 1, the optimal operating point with the minimum power loss is located at a certain point on the trajectory AO. Moreover, both theoretical calculation values and experimental results also show that a certain point on the trajectory AO is the optimal operating point with the minimum power loss, which verifies the correctness of the conclusions in Table 1.

It can be found from FIGS. 6a-b that the optimal operating point with the minimum power loss can be automatically identified by using the JC-VZA for dynamic efficiency optimization of the present invention.

When the coupling coefficient k is set to 0.1, the voltage gain of the output DC voltage of the secondary active rectifier to the input DC voltage of the primary inverter is set to 80 V/40 V, and the load resistances $R_L$ are set to 40Ω and 26.7Ω, respectively; the calculated per-unit charging powers $P_u$ in these two cases are 0.388 and 0.583, respectively. According to Table 1, the WPC system in the aforementioned two cases should operate in the Case IV or Case V, respectively, i.e. the optimal operating points with the minimum power loss is a certain point on the trajectory OB and point B, respectively. Therefore, the ZVS angle of the secondary active rectifier $\varphi^*_{ZAs}$ is set to 0°, and the ZVS angle of the primary inverter $\varphi^*_{ZAp}$ is adjusted in real time through the P&O method to automatically identify the optimal operating point with the minimum power loss.

Figure 7A:
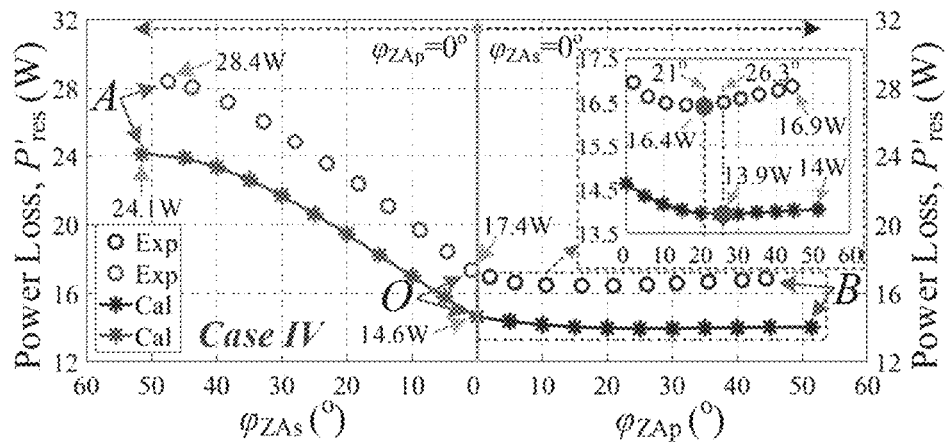
FIG. 7a is a graph of the power loss distribution when the WPC system is in Case IV, in which $V_1$=40 V, $V_2$=80 V, $I_2$=2 A, the load resistance $R_L$=40Ω, the coupling coefficient k=0.1, the voltage gain of the system $K_{cv}$=2, and the per-unit charging power $P_u$=0.388.
Figure 7B:
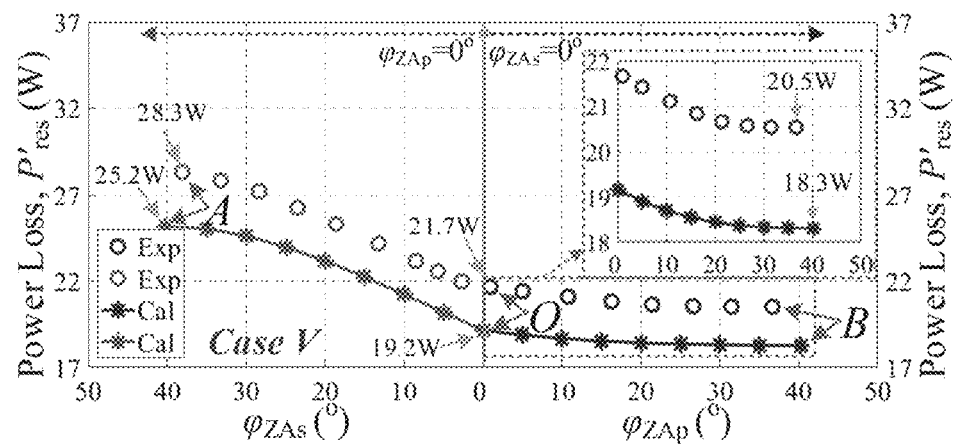
FIG. 7b is a graph of the power loss distribution when the WPC system is, in Case V in which $V_1$=40 V, $V_2$=80 V, $I_2$=3 A, the load resistance $R_L$=26.7Ω, the coupling coefficient k=0.1, the voltage gain of the system $K_{cv}$=2, and the per-unit charging power $P_u$=0.583.

Under the critical ZVS conditions, the relationships between the power loss distribution of the WPC system on the boundary curves and different ZVS angles at these two operating situations are shown in FIGS. 7a-b. In these drawings, the continuous curves drawn by "*" are the theoretical calculation values of the system power losses when the WPC system operates at different ZVS angles. The discrete points plotted by "o" are the measurement values of the system power losses when the WPC system operates at different ZVS angles.

In FIG. 7a, $P_u=0.388<0.5=P_{uc2}$, and the system should operate in Case IV. According to Table 1, the optimal operating point with the minimum power loss is located at a certain point on the trajectory OB. Moreover, both theoretical calculation values and experimental results also show that a certain point on the trajectory OB is the optimal operating point with the minimum power loss, which verifies the correctness of the conclusions in Table 1.

In FIG. 7b, $P_u=0.583>0.5=P_{uc2}$, and the system should operate in Case V. According to Table 1, the optimal operating point with the minimum power loss is located at point B. Moreover, both theoretical calculation values and experimental results also show that point B is the optimal operating point with the minimum power loss, which verifies the correctness of the conclusions in Table 1.

It can be found from FIGS. 7a-b that the optimal operating point with the minimum power loss can be automatically identified by using the JC-VZA for dynamic efficiency optimization of the present invention.

Figure 8:
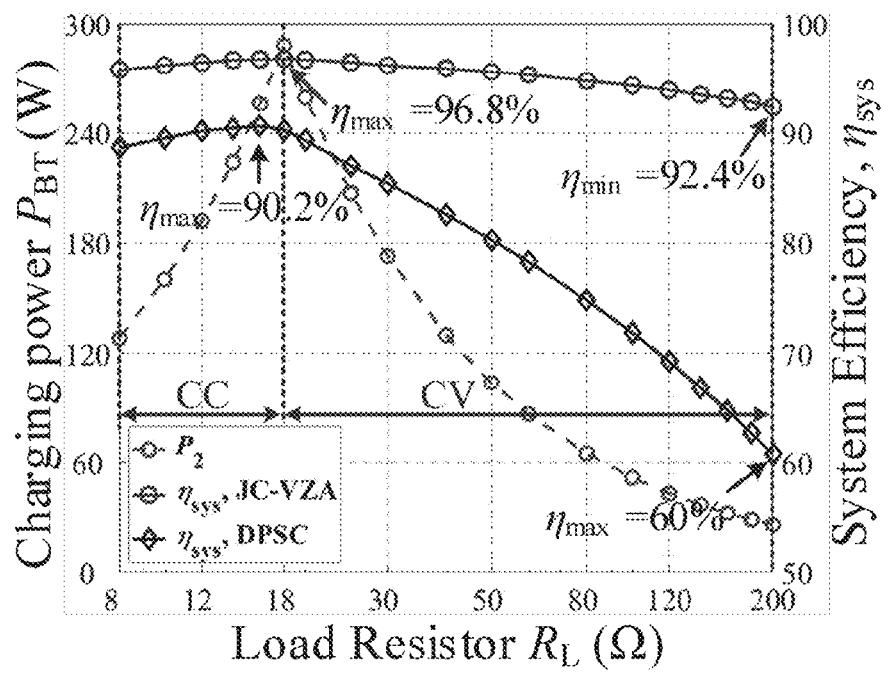
FIG. 8 is a comparison diagram of the system transfer efficiencies when the WPC system operates with the conventional double-sided phase shift control method (DPSC) and the control, method (JC-VZA), respectively, of the present invention, in which the coupling coefficient k=0.2.

In FIG. 8, the WPC system can achieve a very high overall transfer efficiency in the whole charging process of the EV's batteries. Specifically, with a coupling coefficient k of 0.2, the maximum system efficiency reaches 96.8%, under the rated-load condition (i.e., 288 W). Compared with the benchmark WPTS that uses DPSC and impedance matching technique, the WPC system achieves a 6.6% efficiency improvement under rated power as well as a 32.4% improvement under the light-load condition.

In conclusion, the present invention achieves the constant charging voltage or the constant charging current, ZVS of all switches in the primary inverter and the secondary active rectifier, and seeking the maximum transfer efficiency point of the WPC system. In addition, there is not any communication module in the charging voltage/current closed loop. The present invention has the following beneficial effects:

(1) the charging voltage/current closed loop ensures the stability of charging voltage/current of the EV's batteries;

(2) with real-time detection of the input DC voltage $V_1$ and the input DC current $I_1$ of the primary inverter, and the output DC voltage $V_2$ and the output DC current $I_2$ of the secondary active rectifier, the current operating case of the WPC system is determined, and the regulation rules of the ZVS angles of the primary and secondary sides are also determined, which makes the WPC system operate at the optimal operating point with the minimum power loss to achieve the maximum system charging efficiency;

(3) in a wide voltage range, the system can be smoothly adjusted to be located at the optimal operating point, which greatly reduces the overall system power loss and improves the system stability and reliability;

(4) the charging voltage/current closed loop for the EV's batteries is realized without wireless communication techniques, which improves the system reliability significantly, especially in a complex electromagnetic environment; and (5) compared with the traditional DPSC, the WPC system with the proposed JC-VZA for dynamic efficiency optimization greatly simplifies the control strategy, reduces the system cost, and improves the system reliability and overall charging efficiency.

TABLE 1

Operating Conditions and the Minimum Power Losses

| Cases | Regions | Optimal operating points ($D_p$, $D_s$) | Operating conditions | Power Losses |
|---|---|---|---|---|
| I | Point A | $\begin{cases} D_p = \frac{2}{\pi}\arcsin(P_u)^{\frac{1}{2}} \\ D_s = 1 \end{cases}$ | $P_u \geq \frac{2R_1' K_{cv}^2}{R_2'} = P_{uc1}$ and $K_{cv} < \sqrt{\frac{R_2'}{2R_1'}}$ | $\frac{8}{\pi^2 \omega_0^2 M^2}(R_2' V_1^2 P_u + R_1' V_2^2)$ |
| II | Trajectory AO | $\begin{cases} D_p = \frac{2}{\pi}\arcsin\left(\sqrt{2}P_u K_{cv}\sqrt{\frac{R_1'}{R_2'}}\right)^{\frac{1}{3}} \\ D_s = \frac{2}{\pi 2}\arcsin\left(\frac{R_2' P_u}{2R_1' K_{cv}^2}\right)^{\frac{1}{3}} \end{cases}$ | $P_u < \frac{2R_1' K_{cv}^2}{R_2'} = P_{uc1}$ and $K_{cv} < \sqrt{\frac{R_2'}{2R_1'}}$ | $\frac{24}{\pi^2 4\omega_0^2 M^2}\left[\frac{V_1^4 V_2^2 R_1' R_2'^2 P_u^2}{4}\right]^{\frac{1}{3}}$ |
| III | Point O | $D_p = D_s = \frac{2}{\pi}\arcsin(P_u)^{\frac{1}{3}}$ | $\sqrt{\frac{R_2'}{2R_1'}} \leq K_{cv} \leq \sqrt{\frac{2R_2'}{R_1'}}$ | $\frac{8 P_u^{2/3}}{\pi^2 \omega_0^2 M^2}(R_2' V_1^2 + R_1' V_2^2)$ |
| IV | Trajectory AB | $\begin{cases} D_p = \frac{2}{\pi}\arcsin\left(\frac{R_1' P_u K_{cv}^2}{2R_2'}\right)^{\frac{1}{3}} \\ D_s = \frac{2}{\pi}\arcsin\left(\frac{\sqrt{2}P_u}{K_{cv}}\sqrt{\frac{R_2'}{R_1'}}\right)^{\frac{1}{3}} \end{cases}$ | $P_u < \frac{2R_2'}{R_1' K_{cv}^2} = P_{uc2}$ and $K_{cv} < \sqrt{\frac{2R_1'}{R_2'}}$ | $\frac{24}{\pi^2 \omega_0^2 M^2}\left[\frac{V_1^2 V_2^4 R_1'^2 R_2' P_u^2}{4}\right]^{\frac{1}{3}}$ |
| V | Point B | $\begin{cases} D_p = 1 \\ D_s = \frac{2}{\pi}\arcsin(P_u)^{\frac{1}{2}} \end{cases}$ | $P_u \geq \frac{2R_2'}{R_1' K_{cv}^2} = P_{uc2}$ and $K_{cv} < \sqrt{\frac{2R_2'}{R_1'}}$ | $\frac{8}{\pi^2 \omega_0^2 M^2}(R_2' V_1^2 + R_1' V_2^2 P_u)$ |

TABLE 2

Experimental Parameters of the WPC system for the EVs

| Name | Parameter | Value | Unit |
|---|---|---|---|
| Primary resonant inductor | $L_1$ | 118.43 | μH |
| Primary resonant capacitor | $C_1$ | 29.92 | nF |
| Equivalent resistance of primary resonant network | $R_1$ | 0.168 | Ω |
| Secondary resonant inductor | $L_2$ | 118.55 | μH |
| Secondary resonant capacitor | $C_2$ | 29.88 | nF |
| Equivalent resistance of secondary resonant network | $R_2$ | 0.168 | Ω |
| On-time drain-to-source resistance of the MOSFET switch in the primary inverter | $R_{dson1}$ | 0.024 | Ω |
| On-time drain-to-source resistance of the MOSFET switch in the secondary active rectifier | $R_{dson2}$ | 0.024 | Ω |
| Coupling coefficient | k | 0.1-0.2 | / |
| Number of coil turns | $N_1/N_2$ | 15 | |
| Primary resonant frequency | $f_{s1}$ | 84.55 | kHz |
| Secondary resonant frequency | $f_{s2}$ | 84.56 | kHz |

What is claimed is:

1. A joint control method with variable zero-voltage-switching (ZVS) angles for dynamic efficiency optimization in a wireless power charging (WPC) system for electric vehicles (EVs) under ZVS conditions, comprising:
   adjusting a phase-shift duty cycle of a secondary active rectifier to control a charging voltage/current of EV's batteries through a charging voltage/current closed loop;
   adjusting a power angle of the secondary active rectifier to control a ZVS angle of the secondary active rectifier through a secondary ZVS angle closed loop;
   adjusting a phase-shift duty cycle of a primary inverter to control a ZVS angle of the primary inverter through a primary ZVS angle closed loop; and
   detecting an input DC voltage $V_1$ and an input DC current h of the primary inverter in real time; detecting an output DC voltage $V_2$ and an output DC current $I_2$ of the secondary active rectifier in real time; calculating a voltage gain $K_{cv}$ and a per-unit transfer power $P_u$; determining a current operating condition of the WPC system based on the voltage gain $K_{cv}$ and the per-unit transfer power $P_u$; and adjusting the ZVS angle of the primary inverter and the ZVS angle of the secondary active rectifier to automatically identify an optimal operating point with a maximum charging efficiency through a perturb-and-observe method.

2. The joint control method with variable ZVS angles for dynamic efficiency optimization of claim 1, further comprising:
   sampling the input DC voltage $V_1$ and the input DC current $I_1$ of the primary inverter through a controller of the primary inverter to obtain sampled signals, and sampling the output DC voltage $V_2$ and the output DC current h of the secondary active rectifier through a controller of the secondary active rectifier to obtain sampled signals;
   exchanging the sampled signals from the input DC voltage and current of the primary inverter in the primary controller with the sampled signals from the output DC voltage and current of the secondary active rectifier in the secondary controller through a wireless communication technology; and
   calculating current voltage gain $K_{cv}$ and per-unit charging power $P_u$ by the controllers of the primary inverter and the secondary active rectifier, respectively, based on the input DC voltage $V_1$ and the input DC current $I_1$ of the primary inverter, the output DC voltage $V_2$ and the output DC current $I_2$ of the secondary active rectifier, an equivalent series resistance $R'_2$ of a primary resonant network and an equivalent series resistance $R'_2$ of a secondary resonant network, where the current voltage gain $K_{cv}$ is represented as:

$$K_{cv} = \frac{V_2}{V_1};$$

the per-unit charging power $P_u$ is represented as:

$$P_u = \frac{P_2}{P_{2max}} = \sin\left[\frac{D_p\pi}{2}\right]\sin\left[\frac{D_s\pi}{2}\right]\cos[\delta];$$

wherein, $P_2$ is the actual charging power at the DC side of the secondary active rectifier, $P_{2max}$ is the maximum output power at the DC side of the secondary active rectifier, and $P_{2max}$ is represented as:

$$P_{2max} = \frac{8V_1V_2}{\pi^2\omega_0 M};$$

the equivalent series resistance $R'_1$ of the primary resonant network and the equivalent series resistance $R'_2$ of the secondary resonant network are presented as:

$$\begin{cases} R'_1 = R_1 + 2R_{dson1} \\ R'_2 = R_2 + 2R_{dson2} \end{cases};$$

wherein, $R_1$ is the equivalent series resistance of the primary resonant coil and the resonant capacitor, $R_2$ is the equivalent series resistance of the secondary resonant coil and the resonant capacitor, $R_{dson1}$ is the on-time drain-to-source resistance of the MOSFET switch in the primary inverter, and $R_{dson2}$ is the on-time drain-to-source resistance of the MOSFET switch in the secondary active rectifier;

based on the voltage gain $K_{cv}$ and the per-unit charging power $P_u$, the controllers of the primary inverter and the secondary active rectifier determine the optimal operating condition where the WPC system for the EVs achieves the minimum power loss according to the following logic rules:

if $P_u \geq 2R'_1 K_{cv}^2/R'_2 = P_{uc1}$ and $K_{cv} < \sqrt{R'_2/2R'_1}$, the WPC system operates in Case I;

if $P_u < 2R'_1 K_{cv}^2/R'_2 = P_{uc1}$ and $K_{cv} < \sqrt{R'_2/2R'_1}$, the WPC system operates in Case II;

if $\sqrt{R'_2/2R'_1} \leq K_{cv} \leq \sqrt{2R'_2/R'_1}$, the WPC system operates in Case III;

if $P_u < 2R'_2/R'_1 K_{cv}^2 = P_{uc2}$ and $K_{cv} > \sqrt{2R'_2/R'_1}$, the WPC system operates in Case IV; and if $P_u \geq 2R'_2/R'_1 K_{cv}^2 = P_{uc2}$ and $K_{cv} > \sqrt{2R'_2/R'_1}$, the WPC system operates in Case V.

3. The joint control method with variable ZVS angles for dynamic efficiency optimization of claim 2, wherein when the WPC system operates in Case III, the reference values of the ZVS angles of the primary inverter and the secondary active rectifier are set to 0°; when the WPC system operates in Case I or Case II, the reference value of the ZVS angle of the primary inverter is set to 0°, and the ZVS angle of the secondary active rectifier is continuously adjusted with the perturb-and-observe method to obtain a maximum transfer efficiency of the WPC system under ZVS conditions; when the WPC system operates in Case IV or Case V, the reference value of the ZVS angle of the secondary active rectifier is set to 0°, and the ZVS angle of the primary inverter is continuously adjusted with the perturb-and-observe method to obtain the maximum transfer efficiency of the WPC system under ZVS conditions.

4. The joint control method with variable ZVS angles for dynamic efficiency optimization of claim 3, wherein, the step of adjusting the phase-shift duty cycle of the secondary active rectifier to control the charging voltage/current of the EV's batteries through the charging voltage/current closed loop comprises:

sampling the charging voltage and current of the EV's batteries in the charging voltage closed loop and the charging current closed loop to obtain sampled signals; comparing the sampled signals of the charging voltage and current of the EV's batteries with a preset charging voltage reference value and a preset charging current reference value, respectively, to obtain a first error signal of the secondary charging voltage and a first error signal of the secondary charging current;

inputting the first error signal of the secondary charging voltage and the first error signal of the secondary charging current into a PID regulator of the charging voltage closed loop and a PID regulator of the charging current closed loop, respectively; and selecting a smaller output signal between an output signal of the PID regulator of the secondary charging voltage closed loop and an output signal of the PID regulator of the secondary charging current closed loop as the phase-shift duty cycle $D_s$ of the secondary active rectifier after amplitude limiting; adjusting the output DC voltage and the output DC current of the secondary active rectifier through changing the phase-shift duty cycle $D_s$ of the secondary active rectifier to control the charging voltage and the charging current of the EV's batteries.

5. The joint control method with variable ZVS angles for dynamic efficiency optimization of claim 3, wherein, the step of adjusting the power angle of the secondary active rectifier to control the ZVS angle of the secondary active rectifier through the secondary ZVS angle closed loop comprises:

calculating a current feedback signal $\varphi^*_{ZAsfb}$ of the ZVS angle of the secondary active rectifier according to the phase-shift duty cycle $D_s$ and the power angle $\delta$ of the secondary active rectifier at a previous moment in the secondary ZVS angle closed loop;

comparing the current feedback signal $\varphi^*_{ZAsfb}$ of the ZVS angle of the secondary active rectifier with a reference signal $\varphi^*_{ZAs}$ of the secondary ZVS angle to obtain a second error signal; and inputting the second error signal into the PID regulator of the secondary ZVS angle closed loop to obtain an output result of the PID regulator as the power angle $\delta$ of the secondary active rectifier at a next moment, in order to adjust the ZVS angle of the secondary active rectifier.

6. The joint control method with variable ZVS angles for dynamic efficiency optimization of claim 3, wherein, the step of adjusting the phase-shift duty cycle of the primary inverter to control the ZVS angle of the primary inverter through the primary ZVS angle closed loop comprises:

sampling a current feedback signal $\varphi^*_{ZAsfb}$ of the primary inverter ZVS angle in the primary ZVS angle closed loop;

comparing the current feedback signal $\varphi^*_{ZAsfb}$ of the ZVS angle of the primary inverter with a reference signal $\varphi^*_{ZAp}$ of the primary ZVS angle to obtain a third error signal; and inputting the third error signal into the PID regulator of the primary ZVS angle closed loop to obtain an output result of the PID regulator as the phase-shift duty cycle $D_p$ of the primary inverter at a next moment, in order to adjust the ZVS angle of the primary inverter.

* * * * *